United States Patent [19]

Brehm et al.

[11] Patent Number: 5,710,077
[45] Date of Patent: Jan. 20, 1998

[54] METHOD FOR THE GENERATION OF STACKING-FAULT-INDUCED DAMAGE ON THE BACK OF SEMICONDUCTOR WAFERS

[75] Inventors: Gerhard Brehm, Haiming, Germany; Rudolf Mayrhuber, Ostermeithing, Austria; Johann Niedermeier, Burgkirchen, Germany

[73] Assignee: Wacker Siltronic Gesellschaft für Halbleitermaterialien AG, Burghausen, Germany

[21] Appl. No.: 677,916

[22] Filed: Jul. 9, 1996

[30] Foreign Application Priority Data

Sep. 14, 1995 [DE] Germany ............... 195 34 080.9

[51] Int. Cl.[6] .................................. H01L 21/00
[52] U.S. Cl. .............................. 438/472; 438/690
[58] Field of Search ............................ 437/12, 228

[56] References Cited

U.S. PATENT DOCUMENTS

| | | |
|---|---|---|
| 3,905,162 | 9/1975 | Lawrence et al. . |
| 4,144,099 | 3/1979 | Edmonds et al. . |
| 4,587,771 | 5/1986 | Buchner et al. . |
| 5,164,323 | 11/1992 | Brehm et al. . |
| 5,223,734 | 6/1993 | Lowrey et al. ............... 257/401 |
| 5,487,697 | 1/1996 | Jensen ............................. 451/324 |

FOREIGN PATENT DOCUMENTS 0362516  4/1990  European Pat. Off. .

*Primary Examiner*—Charles L. Bowers, Jr.
*Assistant Examiner*—Lynne A. Gurley
*Attorney, Agent, or Firm*—Collard & Roe, P.C.

[57] ABSTRACT

A method for the generation of stacking-fault-induced damage on the back of semiconductor wafers is by treating the back with loose hard-material particles which are suspended in a liquid. The back of the semiconductor wafer is brought into contact with the suspended hard-material particles and the hard-material particles are propelled tangentially to the back, under which circumstances they exert on the back of the semiconductor wafer forces which have essentially only tangentially directed components.

5 Claims, 2 Drawing Sheets

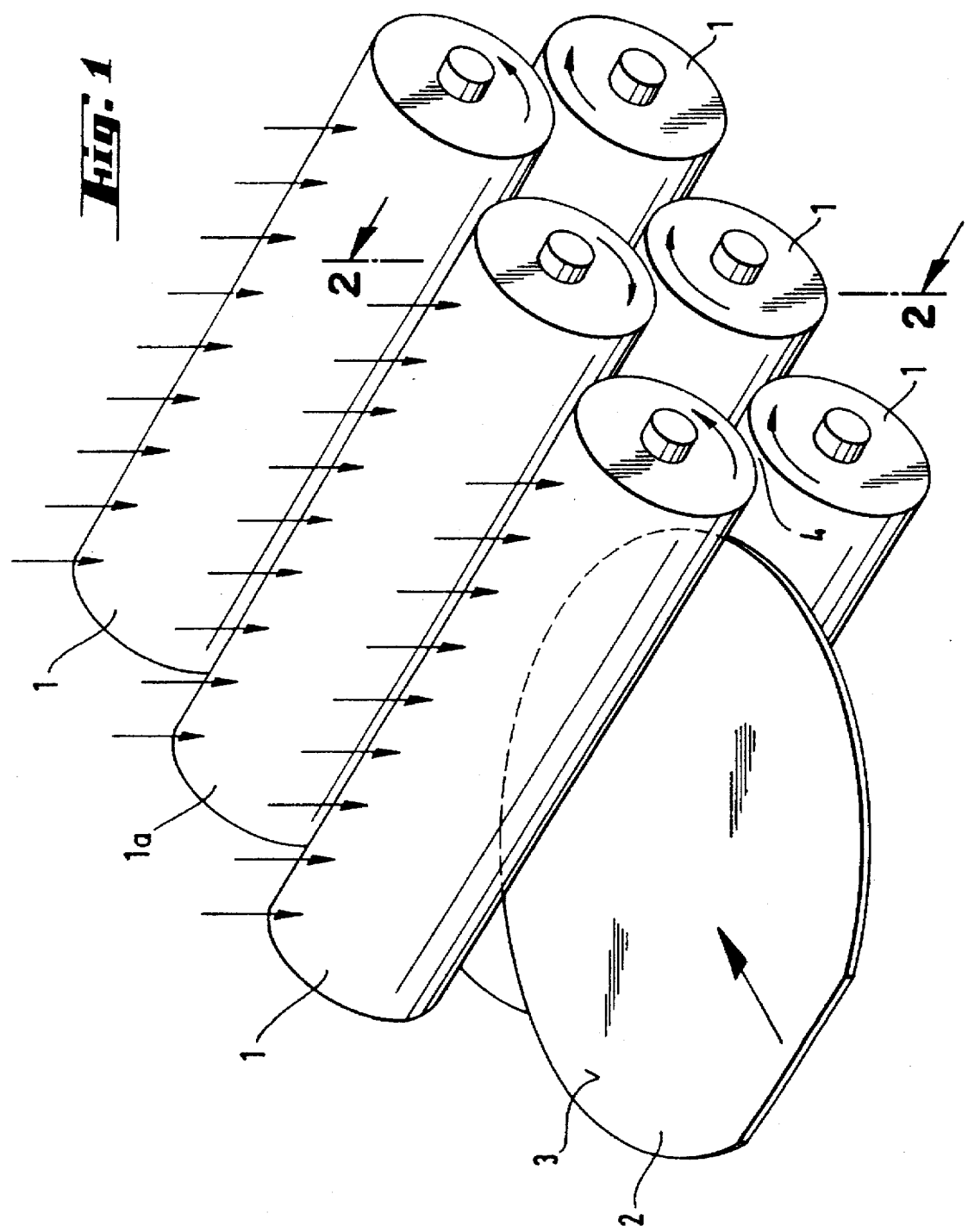

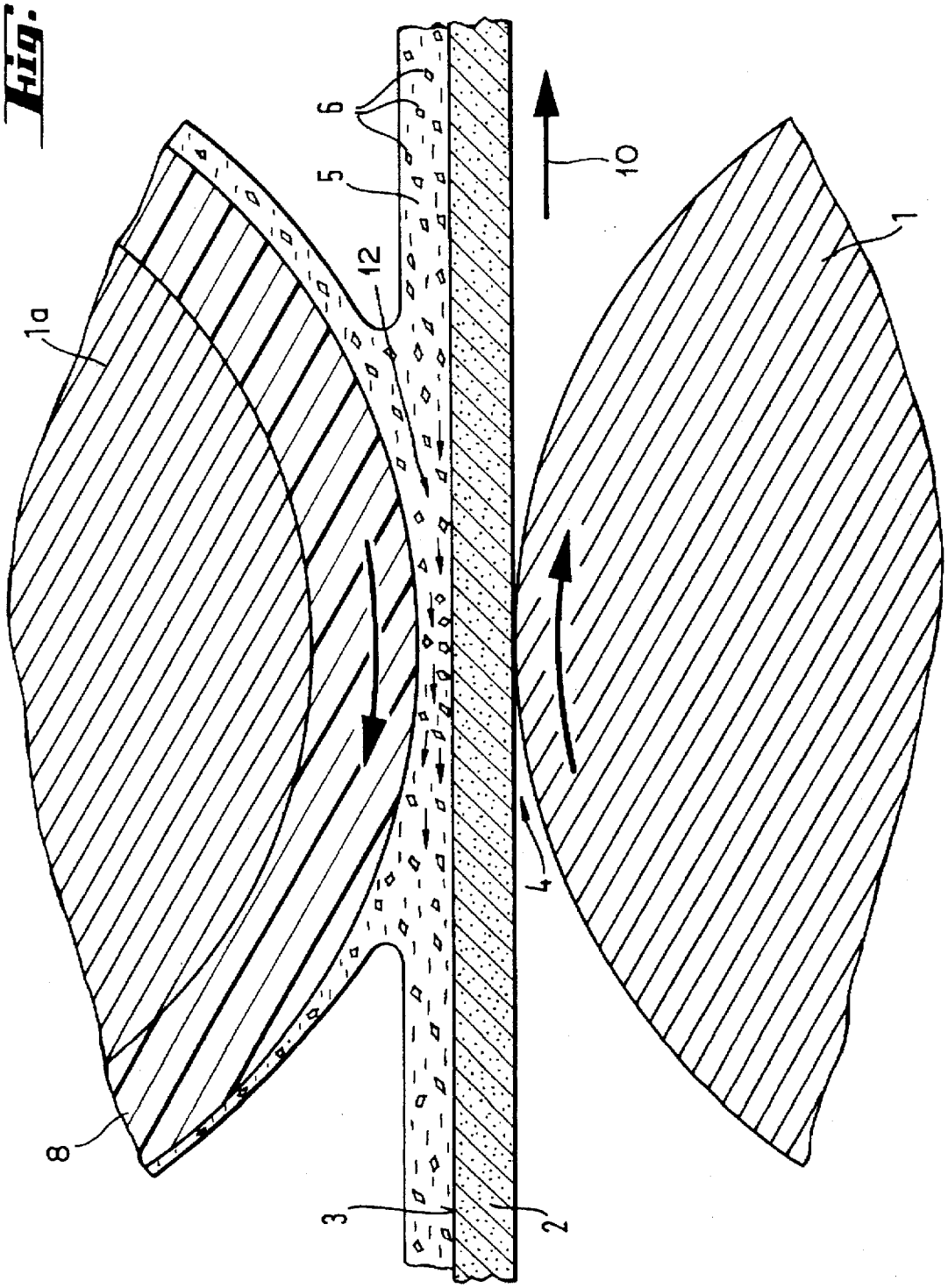

METHOD FOR THE GENERATION OF STACKING-FAULT-INDUCED DAMAGE ON THE BACK OF SEMICONDUCTOR WAFERS

BACKGROUND OF THE INVENTION

1. Field of the Invention

The present invention relates to a method for the generation of stacking-fault-induced damage on the back of semiconductor wafers by treating the back with loose hard-material particles which are suspended in a liquid. The purpose of the intentional damage to the back of semiconductor wafers is the generation of stacking faults which, as so-called centers capable of gettering are able to keep point defects away from electronic components on the front of the semiconductor wafer. The point defects which also include interfering foreign atoms, are drawn away from the front of the semiconductor wafer by the induced stacking faults and bound ("getter effect").

2. The Prior Art

Various methods have been disclosed with which the desired damage to the back of a semiconductor wafer can be achieved. According to the disclosure of U.S. Pat. No. 3,905,162, an attempt has been made, for example, to scratch the back of a semiconductor wafer systematically. Other damage methods are reported in U.S. Pat. No. 5,164,323, for example a method in which the semiconductor wafer is intermittently placed in a bath of fluidized grinding particles or a method in which the back of the semiconductor wafer is subjected to a pressure loading by the erosion-free action of an elastic pressure transfer medium which causes local pressure inhomogeneities.

Under the designation "wet blast", a method has been disclosed in which a jet of a suspension is directed essentially perpendicularly against the back of the semiconductor wafer. This method and all the methods in which the back of the semiconductor wafer is roughened by the action of loose or bound particles or mechanical tools and is exposed in the process to a force acting perpendicularly to the surface of the back exhibit serious disadvantages. In the course of the production of the electronic components on the front of the semiconductor wafer, an ever-increasing number of undesirable particles which may cause the failure of entire groups of components appears. The particles detach themselves from the back, roughened in the manner described, of the semiconductor wafer. In some methods, the mechanical damage to the back is so severe that the semiconductor wafer sags. The integration of electronic components on the front of the semiconductor wafer requires, however, semiconductor wafers having side faces which are as flat as possible. In addition, when the back of the semiconductor wafer is damaged by the action of force which is virtually undefined in relation to its magnitude and its direction, it is unavoidable that the induced stacking faults are inhomogeneously distributed and electronic components fail because the action of the getter effect in their environment is inadequate.

SUMMARY OF THE INVENTION

It is an object of the present invention to provide a damage method in which the induced stacking faults are homogeneously distributed and in which a roughening of the back of the semiconductor wafer results in preventing the generation of undesirable particles. In addition, semiconductor wafers treated by the method are intended to retain their original flat form.

The above object is achieved according to the invention by providing a method for the generation of stacking-fault-induced damage on the back of semiconductor wafers by treating the back with loose hard-material particles which are suspended in a liquid, which method comprises bringing the back of a semiconductor wafer into contact with the suspended hard-material particles and propelling the hard-material particles tangentially to the back, under which circumstances they exert on the back of the semiconductor wafer forces which have essentially only tangentially directed components.

After the semiconductor wafer has been treated, mechanical damage to the back cannot be observed even on viewing under a microscope with the light from a "haze lamp" which reveals the roughness of surfaces. The induced stacking faults, which are homogeneously distributed, only become visible after a test oxidation and the incipient etching of the back. The electronic components envisaged can be integrated into the front of the semiconductor wafer treated according to the invention without contaminating particles being separated from the back of the semiconductor wafer.

The success of the method is based on the fact that an action of mechanical force which is directed mainly perpendicularly against the back of the semiconductor wafer is prevented. Instead, an action of force takes place which is directed essentially tangentially to the back of the semiconductor wafer. In contrast to known methods, the damage is generated solely by minor shearing forces which act in the plane of the back of the semiconductor wafer and which are transmitted by the liquid to the hard-material particles suspended therein. The damage on the back of the semiconductor wafer is therefore limited to the generation of a mechanical stress field which is not accompanied by any macroscopic destruction of the surface.

The hard-material particles ("slurry") suspended in a liquid are applied to the back of the semiconductor wafer as a thin film and propelled tangentially over the wafer surface. The interaction between the suspended hard-material particles and the back of the semiconductor wafer is preferably imparted by a roll arrangement which comprises at least one rotating roll having an elastic surface. As a result of the roll rotation, the suspended hard-material particles are transported between the roll and the back of the semiconductor wafer. At the same time, the semiconductor wafer is fed past the rotating roll in an almost force-free manner. During this process, shearing forces which are directed tangentially and which are transmitted by the liquid to the hard-material particles, build up between the roll and the back of the semiconductor wafer. Because of its elastic surface, the roll is not able to cause stacking-fault-induced damage on the back of the semiconductor wafer without the supply of suspended hard-material particles.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views:

FIG. 1 shows a roll arrangement according to the invention; and

FIG. 2 shows a section view along line A—A of FIG. 1.

DETAILED DESCRIPTION OF THE PREFERRED EMBODIMENTS

Turning now in detail to the drawings, FIG. 1 shows diagrammatically an example of a roll arrangement embodiment having two mutually opposite tiers each of three rolls 1. The semiconductor wafer 2 is transported with back 3 pointing upward through the gap 4 which exists between the two roll tiers. The hard-material particles suspended in the liquid are applied in a uniformly distributed manner to the upper roll tier (shown by perpendicular arrows) and reach the back 3 of the semiconductor wafer 2 as a consequence of the roll rotation. Under these circumstances, the slurry forms a film on the back of the semiconductor wafer in which, as a result of the movement of the rolls 1 and the semiconductor wafer 2, shearing forces build up which are directed essentially tangentially to the back of the wafer. The hard-material particles to which the shearing forces are transmitted ultimately generate the intended stacking-fault-induced damage on the back of the semiconductor wafer.

FIG. 2 shows the diagrammatic representation of a section through the device along the section line A—A in FIG. 1. Situated in the gap 4 between the back 3 of the semiconductor wafer 2 and the roll 1 situated opposite it, is the slurry film composed of liquid 5 and hard-material particles 6.

The rolls of the lower tier function solely as transporting rolls. They can therefore also be replaced, for example, by a conveyor belt on which the front of the semiconductor wafer is laid.

So that the suspended hard-material particles can act in the manner envisaged, at least the surface of the upper rolls which bring the hard-material particles onto the back of the semiconductor wafer must be made of an elastic coating material 8. This prevents forces which are directed essentially perpendicularly against the back of the semiconductor wafer from being transmitted to the hard-material particles via the rolls. The roll coating material 8 should therefore preferably be composed of an elastic plastic, for example of polyurethane (PU) or polyvinyl acetate (PVA). In principle, any elastic plastic is suitable.

The hard-material particles are preferably composed of aluminum oxide, quartz, silicon carbide, zirconium oxide or mixtures of these substances. The mean diameter of the particles is preferably 2 to 150 µm, particularly preferably 2 to 40 µm. The hard-material particles are preferably suspended in water or an aqueous liquid which may contain, in addition to water, also suspension aids and surfactants.

It has been found that the stacking-fault density per unit area which can be achieved by the method is dependent on a number of parameters and can be adjusted by varying one or more parameters systematically. These parameters include, in particular, the concentration of the hard-material particles in the suspension, the elasticity of the roll surface, the rotary speed of the roll during the rotational movement and the treatment time, during which the suspended hard-material particles act on the back of the semiconductor wafer. The method is therefore optimized, preferably by preliminary experiments in which the parameters mentioned are systematically varied, and expediently adjusted to a stacking-fault density per unit area of $1*10^5$ to $1*10^6$ stacking faults/cm$^2$.

As shown in FIG. 2, the method for the generation of stacking-fault-induced damage on the back 3 of a semiconductor wafer 2 comprises propelling a semiconductor wafer 2 in a first direction 10 using at least one rotating roll 1; bringing a back 3 of the semiconductor wafer into contact with loose hard-material particles 6 which are suspended in a liquid 5; and simultaneously propelling the hard-material particles 6 by means of at least one second rotating roll 1a in a direction 12 opposite to the first direction 10 and tangentially to the back 3. Under these circumstances the hard-material particles 6 exert on the back 3 of the semiconductor wafer forces which have tangentially directed components.

Other objects and features of the present invention will become apparent from the following Example, which discloses the embodiments of the present invention. It should be understood, however, that the Example is designed for the purpose of illustration only and not as a definition of the limits of the invention.

EXAMPLE

Silicon semiconductor wafers having a diameter of 125 mm and etched surfaces were treated according to the invention in a roll arrangement corresponding to the drawings. The slurry used was a suspension of $Al_2O_3$ particles (having a mean diameter of 15 µm) in water, to which a suspension aid was additionally added. The concentration of the particles was 4.8% relative to the volume of the suspension. During the treatment time of 10 s, the suspension was uniformly distributed with a volumetric flow of 10 l/min on the rolls situated at the top which were rotating at a rotary speed of 100 min$^{-1}$. The surface of the rolls was composed of an elastic coating 8 of PVA. The roll diameter was 30 mm.

The backs of the treated semiconductor wafers did not exhibit any visible mechanical damage under the microscope in the light of a haze lamp. A stacking-fault test subsequently carried out revealed a density of induced stacking faults of $1.5*10^5$ cm$^{-2}$ homogeneously distributed. The disadvantageous phenomena known from the prior art did not occur in the tested semiconductor wafers.

While several embodiments of the present invention have been shown and described, it is to be understood that many changes and modifications may be made thereunto without departing from the spirit and scope of the invention as defined in the appended claims.

What is claimed is:

1. A method for the generation of stacking-fault-induced damage on the back of a semiconductor wafer, which method comprises:

propelling a semiconductor wafer in a first direction, using at least one rotating roll;

bringing the back of the semiconductor wafer into contact with loose hard-material particles which are suspended in a liquid; and simultaneously propelling the hard-material particles by means of at least one second rotating roll in a direction opposite to said first direction and tangentially to said back of the semiconductor wafer; under which circumstances said hard-material particles exert on said back of the semiconductor wafer forces which have tangentially directed components.

2. The method as claimed in claim 1, wherein the hard-material particles have a mean diameter of 2 to 150 µm and are composed of a material which is selected from a group consisting of $Al_2O_3$, $SiO_2$, SiC, $ZrO_2$ and mixtures thereof.

3. The method as claimed in claim 1, wherein the liquid is selected from a group consisting of water and an aqueous solution.

4. The method as claimed in claim 1, comprising applying the hard-material particles which are suspended in the liquid to the back of the semiconductor wafer with the aid of at least one rotating roll having a surface composed of elastic material; and propelling said hard-material particles tangentially to the back of the semiconductor wafer.

5. The method as claimed in claim 4, comprising
varying induced stacking-fault density systematically as a function of at least one parameter, the parameter being selected from the group consisting of the concentration of the hard-material particles in the liquid, the elasticity of the at least one rotating roll surface, the rotary speed of the at least one rotating roll during the rotational movement and the treatment time during which the hard-material particles which are suspended in the liquid act on the back of the semiconductor wafer.

* * * * *